(12) United States Patent
Lauther

(10) Patent No.: US 8,280,850 B2
(45) Date of Patent: Oct. 2, 2012

(54) METHOD FOR PRODUCING A SIZE-OPTIMIZED DELTA-FILE

(75) Inventor: Ulrich Lauther, München (DE)

(73) Assignee: Siemens Aktiengesellschaft, Munich (DE)

( * ) Notice: Subject to any disclaimer, the term of this patent is extended or adjusted under 35 U.S.C. 154(b) by 877 days.

(21) Appl. No.: 12/310,538

(22) PCT Filed: Aug. 23, 2007

(86) PCT No.: PCT/EP2007/058775
§ 371 (c)(1),
(2), (4) Date: Feb. 27, 2009

(87) PCT Pub. No.: WO2008/025719
PCT Pub. Date: Mar. 6, 2008

(65) Prior Publication Data
US 2010/0191752 A1    Jul. 29, 2010

(30) Foreign Application Priority Data
Aug. 29, 2006 (DE) .......................... 10 2006 040 395

(51) Int. Cl.
G06F 7/00 (2006.01)
G06F 17/00 (2006.01)
(52) U.S. Cl. ...................................................... 707/625
(58) Field of Classification Search ............... 707/625, 707/999.001
See application file for complete search history.

(56) References Cited

U.S. PATENT DOCUMENTS

| 6,401,239 | B1 | 6/2002 | Miron | |
| 2005/0132350 | A1* | 6/2005 | Markley et al. | 717/168 |
| 2006/0039618 | A1 | 2/2006 | Ogle | |
| 2006/0107260 | A1* | 5/2006 | Motta | 717/170 |
| 2006/0112152 | A1* | 5/2006 | Napier et al. | 707/203 |

(Continued)

FOREIGN PATENT DOCUMENTS
EP    1 501 196 A1    1/2005

OTHER PUBLICATIONS

W. Tichy; "The String-to-String Correction Problem with Block Moves"; ACM Transactions on Computer Systems, vol. 2, No. 4, Nov. 1984, pp. 309-321.

(Continued)

*Primary Examiner* — Aleksandr Kerzhner
(74) *Attorney, Agent, or Firm* — Staas & Halsey LLP

(57) ABSTRACT

A delta file which encodes the difference between a first data file and a second data file is produced by determining a set of elemental data strings which are present in the two data files in a partial match in a graph being modeled. In the graph, each network node, representing data processing based on the first data file for producing a data byte of the second data file, is connected by network edges to all network nodes which are associated with a directly preceding data byte of the second data file. The network nodes and network edges are respectively assigned a cost value and a cost-optimized path in the graph is ascertained which, for all the day bytes of the second data file, contains only one network node per data byte. The cost-optimized path is taken as a basis for generating a delta file, containing a sequence of data processing operations and their data fields, which corresponds to the successive series of network nodes in the cost-optimized path.

20 Claims, 2 Drawing Sheets

U.S. PATENT DOCUMENTS

2007/0260647 A1* 11/2007 Jaffri et al. .................. 707/203

OTHER PUBLICATIONS

B. Baker et al.; "Compressing Differences of Executable Code"; Proceedings of ACM SIGPLAN 1999 Workshop on Compiler Support for System Software (WCSSS'99), Apr. 1999; pp. 1-10; printed from citeseer.ist.psu.edu/baker99compressing.html on Mar. 14, 2007.

C. Percival; "Naïve Differences of Executable Code"; 2003; 3 pp.; printed from www.daemonology.net/bsdiff on Mar. 14, 2007.

U. Manber et al.; "Suffix arrays: A new method for on-line string searches"; SIAM J. Comput.; vol. 22; No. 5; 1993; pp. 935-948.

International Search Report for Application No. PCT/EP2007/058775; mailed Dec. 18, 2007.

German Office Action for priority Application No. 10 2006 040 395.9-53.

* cited by examiner

FIG 2A
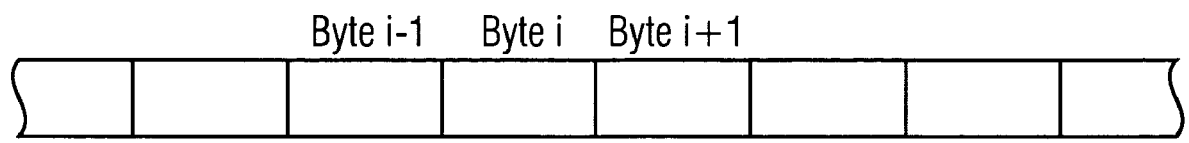
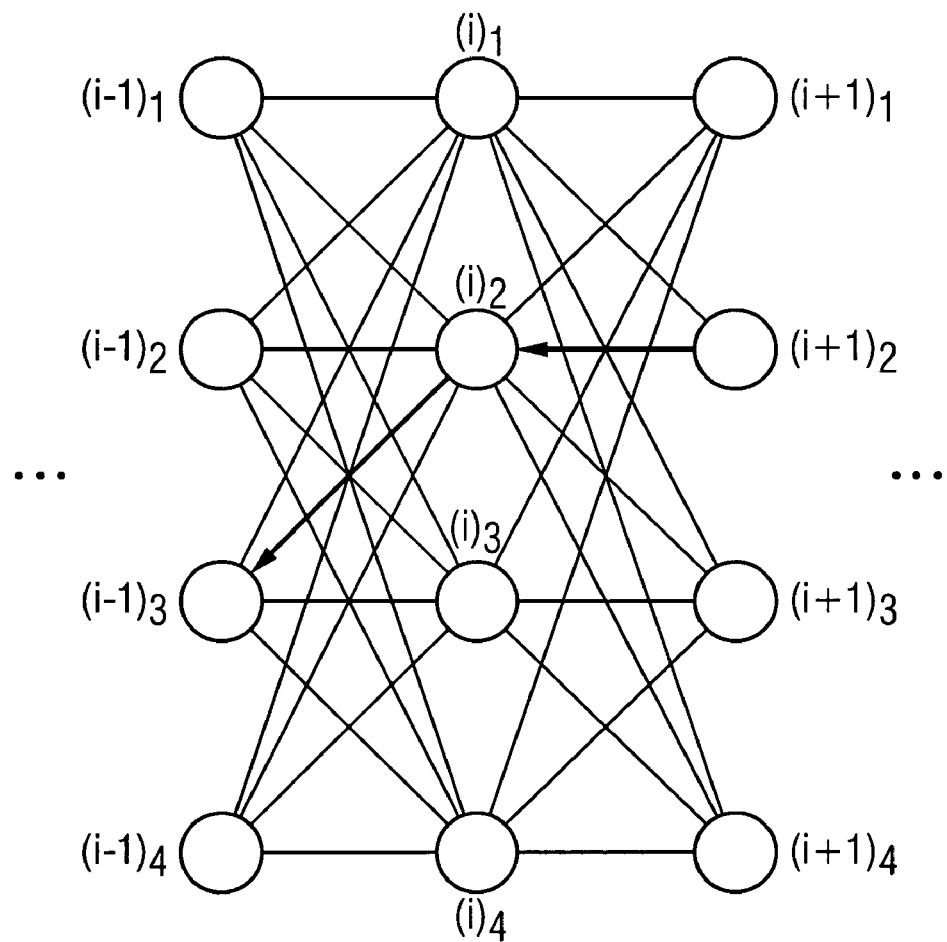
FIG 2B

METHOD FOR PRODUCING A SIZE-OPTIMIZED DELTA-FILE

CROSS REFERENCE TO RELATED APPLICATIONS

This application U.S. National State of International Application No. PCT/EP2007/058775, filed Aug. 23, 2007 and claims the benefit thereof. The International Application claims the benefits of German Application No. 10 2006 040 395.9 filed on Aug. 29,

BACKGROUND

Nowadays it is often necessary to modify software or operating data for executing an application or for operating equipment such as, for example, mobile radio devices or automatic toll detection devices carried on vehicles, in order to eliminate errors thereby, for example, and to implement improved or additional functions ("Software upgrade" or "Software update").

In particular, in the event that the current version of the software or operating data is to be transmitted via an interface with relatively slow and/or expensive data transmission (for example a radio interface in mobile radio), it may be expedient not to transmit the complete data set but to select a different procedure, in which only the "difference" between the older version and the newer version is transmitted, and subsequently by the transmitted difference the newer version is generated from the older version which is already present.

To this end, the production of a delta-file by a delta-file generator of a first computer (server) is known, for example, from the U.S. Pat. No. 6,401,239. The delta-file which encodes the difference between the first version and the second version of a data file is transmitted to a second computer (client), on which the first version of the data file is stored, the second version of the data file being generated from the first version thereof and the delta-file by a restorer.

A key problem in this regard is the production of a delta-file of the smallest possible size, in order to minimize thereby the necessary transmission time for transmitting the delta-file and/or the resulting transmission costs.

The production of a delta-file is, for example, disclosed in Walter F. Tichy, "The String-to-String Correction Problem with Block Moves", ACM Trans. on Computer systems, Vol. 2, No. 4, November 1984, pages 309-321.

For explaining the method disclosed in that publication, reference is made to FIG. 1. Accordingly, two different data files, of which one (for example a newer version of a data file) is to be generated by a delta-file from the other (for example an older version of the data file), are acquired as two data strings, denoted S0 and S1. In order to produce a delta-file, initially a set of non-overlapping, maximum (exact) "matches" is sought, i.e. elemental data strings with identical characters and maximum length, which occur both in S0 and in S1, although in different positions of the respective data string.

The result is a sequence of matches and gaps, which is shown for example in FIG. 1 for S1 (above in FIG. 1) and for S0 (below in FIG. 1). Two exactly matching elemental data strings are identified by the two arrows illustrated as an example in FIG. 1.

Subsequently, based on the exactly matching elemental data string found, a delta-file is generated containing a series of data processing operations (or commands) to be carried out successively on the first data file S0, in this case COPY- and ADD-operations, a COPY-operation respectively resulting from the exactly matching data regions and an ADD-operation respectively resulting from the gaps located between the exactly matching data regions.

A COPY-command, which in the example shown typically has the syntax "COPY <length> <offset in S0> <offset in S1>", copies an exactly matching data region, which is located in the data string S0 at the position <offset in S0> and has the length <length>, according to S1 and namely at the position <offset in S1>. On the other hand, an ADD-command, which typically has the syntax "ADD <length> <data of S1>", adds data of the length <length>, which has to be incorporated in the delta-file, into the gaps between the exactly matching data regions in S1. In this manner, the second data file S1 may be generated by "processing" the successive sequence of COPY- and ADD-operations from the first data file.

In the method shown, the size of the delta-file is determined by the size of the exactly matching data regions, greater matches reducing the volume of data to be transported in the delta-file. The overlap having maximum matches may be calculated nowadays in a very efficient manner by modern data structures, such as are known for example from bioinformatics for calculating very long DNA-strands. The delta-file produced is typically compressed before transmission and decompressed before the update and/or upgrade process.

The method set forth has the drawback that it may occur that very many data processing operations which are to be successively processed have to be contained in the delta-file, to generate a second data file from a first data file.

This drawback may be eliminated if, instead of exactly matching elemental data regions in the two data files, so-called "pseudo-matches" are used, having data regions which are only approximately the same and/or slightly different from one another.

In this case, in a delta-file for every pseudo-match, the difference of the slightly different elemental data regions is stored in a byte-wise manner, the difference-bytes which result from the exactly matching data of a pseudo-match being zero, whilst the difference-bytes which result from the data which are different from one another of a pseudo-match are generally different from zero. The difference for a pseudo-match substantially consists of zeros (zero bytes) and is thus highly compressible.

Based on the pseudo-matching elemental data strings ascertained, a delta-file is subsequently generated which defines a series of data processing operations or commands to be carried out successively on the first data file, namely DIFF- and ADD-operations, a DIFF-operation respectively resulting from the approximately matching data regions and an ADD-command respectively resulting from the gaps located therebetween.

A DIFF-command, by byte-wise addition of its bytes to the corresponding values in the first data file in the presence of a zero byte in the difference, copies data of the first data file (from the position of the first data file corresponding to the zero byte, to the corresponding position of the second data file) and in the presence of a non-zero byte copies the sum of the byte of the first data file and the data from the DIFF-command to the corresponding position in the second data file.

In contrast to delta-files which are based on exactly matching data regions (matches), by using only approximately matching data regions (pseudo-matches) the number of pseudo-matches and thus the number of data processing operations to be transmitted in the delta-file may be markedly reduced.

The use of pseudo-matches may be derived from the program code of the freely available software tool, "bsdiff", about which however nothing further is documented.

In principle, with the use of pseudo-matches a trade-off has to be made between a few long pseudo-matches with many non-zero bytes and many short pseudo-matches with few non-zero bytes. Whilst the first-mentioned case is worse for data compression, it is advantageous with regard to the lower number of data processing commands. On the other hand, the last-mentioned case is better for data compression, whilst it is disadvantageous with regard to the greater number of data processing commands.

Accordingly, with the production of delta-files based on pseudo-matches an optimization problem is present, which concerns the selection of the matches to be used and the combining thereof to form pseudo-matches. In the above-mentioned software tool, bsdiff, a heuristic is used to this end which is barely decipherable.

SUMMARY

A method is described below for producing a delta-file, by which an optimization of the size (data volume) of the delta-file may be achieved.

Accordingly, a method is shown for producing a delta-file (delta patch) encoding the difference between a first data file and a second data file, whereby the two data files are respectively acquired as data strings (data sequences).

In the method, initially a set of elemental data strings ("pseudo-matches") which are present in the two data files in a partial match is determined and the delta-file generated based on the pseudo-matches. The basic idea of the method is thus, within the scope of graph theory, that a network (graph) is modeled with network nodes and network edges connecting the network nodes, each network node representing a "state" of a data byte of the successive arrangement of data bytes of the second data file. Additionally, each network node associated with a data byte is connected by network edges to all network nodes which are associated with a directly preceding data byte. By the assignment of cost values to the network nodes and network edges, by connecting the network nodes to the source and sink, a cost-optimized path may be ascertained by the network, which in the transmission to the associated states of the data bytes of the second data file corresponds to a size-optimized delta-file. Advantageously, the delta-file is subsequently compressed.

"States" of data bytes are possible data processing operations (or commands) based on data bytes of the first data file which, in combination with data fields belonging to the data processing operations, are used for producing data bytes of the second data file. Such data processing operations may, for example, be "ADD-operations" and "DIFF-operations", respectively specific to a pseudo-match. The ADD-operation thus reads the associated data byte from the delta-file (input) and effects the storing thereof at the current position in the second data file, which is subsequently updated. In other words, the ADD-operation read a data field from the delta-file associated with this ADD-operation and effects the storage thereof at a position in the second data file which corresponds to the position of the data byte with which the ADD-operation is associated. The respective DIFF-operations specific to a different pseudo-match store a byte-wise sum of the data bytes (from the first data file and data content of the DIFF-command) corresponding to the respective use of the pseudo-match at the current position in the second data file. In other words, the DIFF-operation specific to a pseudo-match stores a data byte sum, totaled from a data field (byte) of the DIFF-operation and a corresponding data byte of the pseudo-match of the first data file, at a position in the second data file which corresponds to the position of the data byte to which the DIFF-operation is assigned. In order to be able to model the different states of the data bytes of the second data file as network nodes, possible data processing operations (in particular all) are ascertained for producing data bytes of the second data file based on data bytes of the first data file. Particularly advantageously, the data processing operations, such as DIFF-operations, are specific to pseudo-matches.

In an advantageous manner for modeling the graph, the network nodes are arranged in the form of a matrix, successive columns of the matrix-shaped arrangement of network nodes being assigned to the successive data bytes (byte sequence) of the second data file. In this case, it is advantageous if, within a column, different lines are associated with the different states of the same data byte of the second data file.

Advantageously, for ascertaining a cost-optimized path by the graph a cost value is assigned to each network node which is not equal to zero if the state associated with the network node produces a data byte in the delta-file which is different from zero and, on the other hand, is zero if the state associated with the network node produces a data byte in the delta-file equal to zero (zero data byte). Moreover, a cost value is advantageously assigned to each network edge which is zero if the network nodes connected by a network edge belong to the same or compatible pseudo-matches and, on the other hand, is not equal to zero if the network nodes connected by a network edge belong to different pseudo-matches, i.e. for example a new DIFF- or ADD-command is necessary.

If the graph is created in the manner shown, a cost-optimized path is ascertained in the graph, which minimizes the sum of the number of non-zero bytes and costs of the data processing operations, such as ADD- and DIFF-operations. A permissible path may in this case contain only one network node per data byte for all data bytes of the second data file.

From the ascertained cost-optimized path, a delta-file is generated which contains a series, corresponding to the successive sequence of data bytes of the second data file, of data processing operations associated with the network nodes of the cost-optimized path, such as ADD- or DIFF-operations.

By the method described herein, a size-optimized delta-file based on pseudo-matches may be produced for generating a second data file from a first data file. By using a size-optimized delta-file, the transmission time and transmission costs for the delta-file may be advantageously reduced. The method is accordingly suitable, in particular, for producing delta-files for transmission by interfaces, which have a low data transmission rate and/or high data transmission costs.

In a further advantageous embodiment of the method, the production of the pseudo-matches may take place such that initially a set of exactly matching elemental data regions ("matches") present in the two data files is ascertained. In this case, advantageously they are maximum matches with a maximum length. The matches are subsequently ascertained, the positions thereof respectively differing in the first and in the second data files by the same amount, so-called "compatible matches" and pseudo-matches are produced, respectively by combining a plurality of compatible matches to form a separate combined data region.

In a further advantageous embodiment of the method, a reduction of pseudo-matches may take place, based on a cost comparison of costs which occur if a match is used or not known within the gap of a pseudo-match.

In a further advantageous embodiment of the method, a set of non-overlapping pseudo-matches is produced from the pseudo-matches, which maximizes the overlapping of the second data file with exact matches.

The method may be embodied in a machine-readable program code (computer program) for an electronic data processing device, which contains control commands which cause the electronic data processing device to carry out a method as described below.

Moreover, the program code may be recorded on a storage medium (computer program product) for an electronic data processing device, which contains control commands which cause the electronic data processing device to carry out the method according to the invention described below.

BRIEF DESCRIPTION OF THE DRAWINGS

These and other aspects and advantages will become more apparent and more readily appreciated from the following description of an exemplary embodiment, taken in conjunction with the accompanying drawings of which:

FIG. 2A is a schematic view of a portion of a data file.

FIG. 2B is a graph of the method in which states of data bytes are modeled as network nodes.

DETAILED DESCRIPTION OF THE PREFERRED EMBODIMENT

Figure 1:
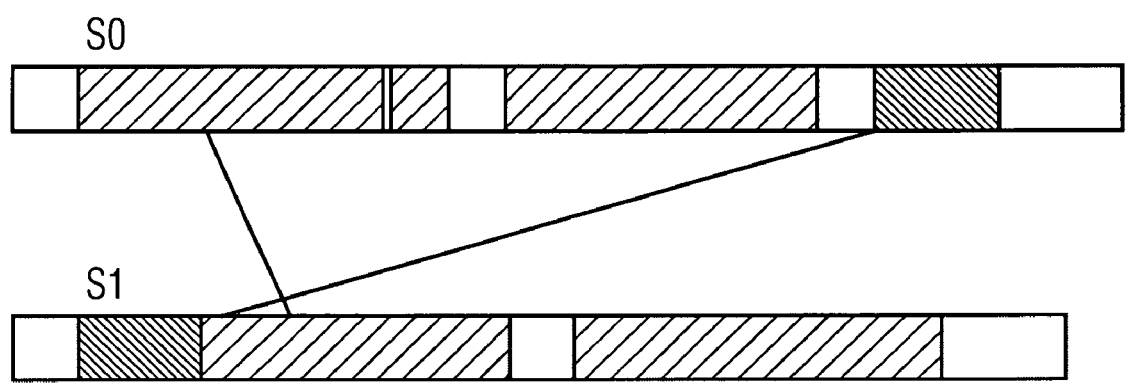
FIG. 1 is a schematic view of two data files showing exactly matching elemental data strings (matches) in the two data files.

Reference will now be made in detail to the exemplary embodiments, examples of which are illustrated in the accompanying drawings, wherein like reference numerals refer to like elements throughout.

FIG. 1 has been already described in the introduction, which is why a more detailed explanation is superfluous here.

Accordingly, an exemplary embodiment of the method will be shown and explained, in which a plurality of operations are described in detail:

In the embodiment, a delta-file based on pseudo-matches is intended to be generated, by which a second data file may be produced from a first data file. The second data file may in this case be a data file for updating or upgrading the first data file.

Ascertaining Exact Matches

Initially the second data file is overlapped as fully as possible by a sequence of maximum exact matches, i.e. completely matching data regions of the two data files, which have a maximum data length.

For rapidly finding such exact matches, for example a method may be used which is disclosed in U. Manber, E. W. Myers, "Suffix arrays: a new method for on-line string searches", SIAM J. Comput. 22(5), 1993, pages 935-948.

Accordingly, from the first data file initially an arrangement of elemental data strings, a so-called "suffix array" is ascertained, namely a sorted set, which contains all suffixes (elemental data strings) of a data string.

For example, the data string "foo" contains the suffixes "foo", "oo" and "o". The suffix array is stored as an array of sorted indices of the substrings, in the present example (0, 2, 1) for "foo", "o" and "oo".

For creating a suffix array, and for searching maximum matching elemental data strings, efficient algorithms are available in the related art and known as such to the person skilled in the art.

If a suffix array is created, the second data file is passed through from start to finish, (exact) matches being identified and stored in a list. This may, for example, be described by the following pseudo-code:

```
build suffix array SA from old file;
List matches;
int new_size = length of new file;
int scan = 0;
while (scan < new_size) {
    (pos0, length) = find_maximum_match (SA, scan);
    if (length > 0) {
        matches.append(new Match(pos0, scan, length));
        scan+=length;
    }
    else scan++;
}
```

The procedure find_maximum_match searches for a maximum match (exactly matching elemental data region) in the first data file relative to the elemental data string, which begins at the scan position in the second data file. It sends back the position in the first data file and the length of the match. In a successful case (length>0) the match is stored in the list of matches and in the second data file the corresponding length may be skipped. Otherwise, the scan position is increased by the increment 1. Sequences of such non-matching operations correspond to the gaps in FIG. 1. Two modifications may, for example, be carried out to form this algorithm.

Modification 1:

If a match M1 is found, which directly follows (i.e. without a gap) a preceding match M0, it is verified whether M1 may be extended backwards, as the "scan-1" position in the previous executed loop has not been investigated. If this is the case, and if the resulting M1 is longer than the correspondingly reduced M1, it is advantageous if this modification is carried out, as longer matches are desirable.

Modification 2:

If the length of a match is below a predetermined limit, it is verified whether a deletion of this match would increase the costs: if the answer is no, this match is deleted, in order to avoid storing a large number of small useless matches; if the answer is yes, this match is not deleted. In this case the contribution to the length of the compressed delta-file is regarded as "costs". This is approximately determined by the number of non-zero bytes in the delta-file plus cost components for the individual COPY-, ADD- and DIFF-commands.

Production of Pseudo-Matches

Next, pseudo-matches are generated from the (exact) matches ascertained. In this case, compatible exact matches are respectively combined to form a pseudo-match, such exact matches being regarded as compatible exact matches, the positions ("pos0") thereof in the first data file and the positions ("pos1") thereof in the second data file differing by the same amount. (Viewed in FIG. 1, compatible exact matches have shading lines parallel to one another). When the difference of the second data file from the first data file is formed, only the gap between the compatible exact matches is able to produce non-zero bytes. In other words, all exact matches are compatible, for which the difference (pos1−pos0) has the same value.

In order to produce the pseudo-matches, all exact matches are sorted according to this difference (pos1−pos0), a sequence of bundles being obtained with the same difference. Each of these bundles corresponds to a pseudo-match.

In this procedure, each exact match belongs specifically to a pseudo-match. Pseudo-matches may overlap one another, an exact match of the compatible exact matches of a pseudo-match falling into the gap of the compatible exact match of a further pseudo-match.

Splitting Pseudo-Matches

The pseudo-matches produced in by combining compatible exact matches, may occasionally be very long and accordingly contain large gaps (only to be closed at great cost). Thus, each gap in a pseudo-match is investigated as well as the matches (from other pseudo-matches) inside this gap. In this case, the costs which arise when the match is used inside the gap of a pseudo-match (in this case two DIFF-commands are produced) and the costs which occur when it is not known (in this case additional non-zero bytes are produced in the delta-file) are compared. If the first-mentioned costs are lower, the pseudo-match is subdivided; if the second-mentioned costs are lower, the pseudo-match is not subdivided.

Selection of Pseudo-Match Candidates

Next, a set of perfect pseudo-matches are selected. In this connection, from the set of all (generally) overlapping pseudo-matches a partial set (or chain) of non-overlapping pseudo-matches is determined, which maximizes the overlapping of the second data file with exact matches or—equivalent thereto—minimizes the length of the gaps.

To this end, proceeding from the fact that in an optimal chain $c_n$ of n pseudo-matches $p_1, p_2 \ldots p_n$, each partial chain $c_i$ of i pseudo-matches $p_1, p_2, \ldots p_i$ also has to be an optimal partial chain. Thus the optimal chain $c_n$ may be found as an extension of an optimal partial chain $c_{n-1}$.

From this results a dynamic program for determining the optimal chain, which may be carried out easily by passing from left to right over the pseudo-matches, if initially the pseudo-matches are sorted according to their left and right ends and in each pseudo-match the overlapping of an optimal chain, which ends with this pseudo-match, is stored.

In the following exemplary pseudo-code, "cover(g)" is the number of matching bytes of a pseudo-match "g", i.e. the total length of the exact matches of which the pseudo-match consists; "total_cover(g)" is the total length of the matches of a chain of pseudo-matches, whose element is g.

```
List starting;
List ending;
add all pseudo-matches to lists starting and ending;
sort list starting by left end;
sort list ending by right end;
Pseudo*e = ending.first( );
Pseudo*best_ending = 0;
int best_cover = 0;
for all pseudos s sorted by left end {
    // maintain best group e ending before s:
    while (right end of e < left end of s) {
        if (total_cover(e) > best_cover) {
            best_cover = total_cover(e);
            best_ending = e;
        }
        e = successor of e in list ending_groups;
    }
    pred(s) = best_ending; // let s point to
           best_ending
    total_cover(s) = cover(s) +
           total_cover(best_ending);
}
```

Henceforth the pseudo-match is sought with the maximum value "total_cover", the "pred" backpointers being followed in order to pass through the entire optimal chain.

Association of Bytes of the Second Data File with Pseudo-Match Candidates

Following is a description of the main optimization of the method. In this case, for each byte of the second data file it is decided whether it is associated with a pseudo-match and if the answer is yes, to which pseudo-match.

If a byte of the second data file is associated with a pseudo-match, it becomes part of a DIFF-operation and the difference between the value of this byte and the value of the corresponding byte is stored in the first data file. In the alternative case that a byte of the second data file is not associated with a pseudo-match, it becomes part of an ADD-operation and its value is stored.

If the byte associated with a pseudo-match belongs to the exactly matching data regions of the pseudo-match, the difference is zero; otherwise the difference is not zero. With elements of the ADD-operations the difference may be different from zero. The purpose of optimization is to minimize the number of these bytes which are different from zero, as they reduce the compressibility of the resulting delta file.

The number of non-zero bytes is, however, only one aspect of the target function. A further aspect of the target function is the storage requirement for the DIFF- and ADD-operations, i.e. for the operation code, position and length information. Whether a new command has to be transmitted for a byte, depends on the decisions for this byte and the preceding byte, i.e. the entire context has to be considered.

In this core of the method, the decision is made whether and to which pseudo-match a byte of the second data file is associated, by dynamic programming, or the equivalent, by calculating a shortest (i.e. cost-optimized) path in a graph which is modeled as follows.

Reference is now made to FIG. 2, wherein in a schematic representation a graph of the dynamic program of the method is illustrated. Additionally in FIG. 2 the successive sequence of bytes of the second data file is shown.

For modeling the graph of FIG. 2B the possible states of the data bytes of the successive sequence of data bytes of the second data file are acquired as network nodes. In this case, for each byte of the second data file, as is shown in FIG. 2A by way of example for the successive bytes (i−1), (i) and (i+1), k network nodes are arranged in the vertical columns of the graph (in FIG. 2B, k=4) which respectively correspond to the states of a respective data byte of the second data file. The states for the data byte (i−1) are $(i-1)_1$, $(i-1)_2$, $(i-1)_3$ and $(i-1)_4$, the states for the data byte i are $(i)_1$, $(i)_2$, $(i)_3$ and $(i)_4$, and the states for the data byte (i+1) are $(i+1)_1$, $(i+1)_2$, $(i+1)_3$ and $(i+1)_4$.

Possible states of any data byte of the second data file may be: an ADD-command, which causes this data byte to be read from the input (delta-file and/or data field of the ADD-command), and $\text{DIFF}_{match\,j}$-commands, which respectively cause the byte sum, totaled from the difference of this data byte from the data byte in the corresponding position in the first data file, which corresponds to the use of pseudo-match j, and the corresponding data byte in the first data file, to be stored.

In the graph, each network node is assigned a cost value which is different from zero, for example 1, or zero, according to whether this state produces a non-zero byte or a zero byte in the delta-file.

Additionally, each network node of the graph associated with one data byte is connected by network edges to each network node associated with the directly preceding data byte. Also a cost value is associated with the network edges, namely zero if the two connected network nodes belong to the same or compatible pseudo-matches and not equal to zero, for example 1, in the other case when a new operation is required. In the last-mentioned case, the costs of this operation are entered.

For the graph created with associated cost values for network nodes and network edges, the shortest (cost-optimized) path in the graph is ascertained by an algorithm.

A path through this network, which specifically contains one network node from each column, corresponds to a permissible sequence of DIFF- and ADD-operations, which covers all data bytes and thus produces a correct delta-file. The shortest path of all such paths minimizes the sum of the number of non-zero bytes and the costs of the ADD- and DIFF-commands: Such a shortest (cost-optimized) path in the graph may be produced by an algorithm shown as below for ascertaining the shortest path.

Although there are $k^n$ different paths for a second data file of the length n, the shortest path due to the specific structure of the graph may be found in $O(k^2n)$ steps. This is shown by way of example in the following pseudo-code:

```
for all positions i = 1 ... n of the new file {
    update set of candidate matches;
    allocate one node per candidate;
    for all nodes v at current position {
        int best_cost = ∞;
        for all nodes w at previous position {
            cost_w_v = total_cost(w) + cost(w,v) + cost
            (v);
            if (cost_w_v) < best_cost) {
                best_cost = cost_v_w;
                best_pred = w;
            }
        }
        pred(v) = best_pred;
        total_cost(v) =best_cost;
    }
}
```

After all positions have been processed (main loop in the above pseudo-code), from the last column the network node with the smallest "total_cost" value is selected and the "pred-pointers" (illustrated in bold in FIG. 2B) followed backwards in order to identify the shortest (cheapest) path. Subsequently, the ADD- and DIFF-operations of the delta-file are produced corresponding to the byte associations along this path.

Hereinafter further modifications of the method are described:

Modification 3: Set of Pseudo-Match Candidates and the Updating Thereof.

As the state of a network node corresponds to the assignment of the relevant data byte to a pseudo-match, it is advantageous to keep a set of suitable pseudo-matches available, and to update the pseudo-matches when passing through the above pseudo-code. To this end, firstly the pseudo-match from the chain calculated in "selection of pseudo-match candidates" is received into this set, which overlaps the current position; secondly a predeterminable number of matches is received from the surroundings of the current position. During the transition to a new position, this set is updated, i.e. elements at the rear leave the set and matches at the front are inserted.

Modification 4: Reduction of the Storage Requirement of the Method

If the method is implemented as disclosed, k×n network nodes have to be stored, of which each network node contains the accumulated costs of the best path through these network nodes, the pointer to the predecessor-network node in the best path and a pointer to the associated match. These are 12 k data bytes per input data byte and thus a comparatively large number for large input files. Added to this is the storage requirement for $k^2n$ edges. This may be avoided by four modifications to the basic algorithm:

Modification 4.1:

The "total_cost" field is only required in the network nodes of the current and the previous columns. Therefore two node types are used, a large node type with a "total_cost" field for these specific columns and a small node type for "old" columns.

Modification 4.2:

The number of the shortest paths to which a network node belongs is stored, i.e. the number of incoming bold edges as is shown in FIG. 2B. If after processing column i this value is zero for a network node in column (i–1), it may be deleted. Thus in the predecessor-network node this value is decremented and possibly this network node is also deleted, and so on.

Modification 4.3:

A length field is inserted into the network node, which initially obtains the cost value 1. If a current node "u" and its predecessor-network nodes "v" refer to the same (or two compatible) match(es), the "pred" pointer of "u" may point to "pred(v)", the number of shortest paths in "v" reduces by 1 and the length in "u" increases by the length of "v". Subsequently "v" and the predecessor may be possibly deleted. A node now no longer represents an individual data byte, but a sequence of data bytes which are treated equally, i.e. a pseudo-match. This reduces the storage requirement dramatically.

Modification 4.4:

Edges are not stored but their cost values are ascertained "on-the-fly", if they are required.

The system also includes permanent or removable storage, such as magnetic and optical discs, RAM, ROM, etc. on which the process and data structures of the present invention can be stored and distributed. The processes can also be distributed via, for example, downloading over a network such as the Internet. The system can output the results to a display device, printer, readily accessible memory or another computer on a network.

A description has been provided with particular reference to preferred embodiments-thereof and examples, but it will be understood that variations and modifications can be effected within the spirit and scope of the claims which may include the phrase "at least one of A, B and C" as an alternative expression that means one or more of A, B and C may be used, contrary to the holding in *Superguide* v. *DIRECTV,* 358 F3d 870, 69 USPQ2d 1865 (Fed. Cir. 2004).

The invention claimed is:

1. A method for producing a delta-file encoding differences between a first data file and a second data file, each formed of data bytes, comprising:

determining a set of elemental data strings defined as pseudo-matches present in the two data files in a partial match;

modeling a graph of network nodes and network edges in which each network node represents a data processing operation based on the first data file for producing one of the data bytes of the second data file, and each related node, associated with a data byte of the second data file in the graph, is connected by related network edges to all preceding network nodes associated with a directly preceding data byte of the second data file;

assigning the network nodes and the network edges, respectively, a cost value;

ascertaining a cost-optimized path in the graph which, for all data bytes of the second data file, contains only one network node per data byte; and generating a delta-file, based on the cost-optimized path, containing a series of data processing operations and data fields corresponding to a successive sequence of network nodes in the cost-optimized path.

2. The method as claimed in claim 1, wherein the data processing operations based on the first data file for producing one of the data bytes of the second data file are respectively specific to a pseudo-match.

3. The method as claimed in claim 2,
wherein the data processing operations based on the first data file for producing one of the data bytes of the second data file include ADD-operations and Diff-operations,
wherein reading of an ADD data field associated with an ADD-operation from the delta-file is effected by an ADD-operation, and storage thereof is effected at a first position in the second data file corresponding to a second position of the data byte with which the ADD-operation is associated, and
wherein said generating includes storing a data byte sum, totaled from a DIFF data field of a DIFF-operation and a corresponding data byte of the pseudo-match of the first data file, by a specific DIFF-operation for a specific pseudo-match at a third position in the second data file which corresponds to a fourth position of the data byte to which the specific DIFF-operation is assigned.

4. The method as claimed in claim 1, wherein said modeling of the graph uses a matrix formed of lines and columns with successive columns of the graph assigned to successive data bytes of the second data file.

5. The method as claimed in claim 1, wherein a non-zero cost value is assigned to each network node for which a state associated with the network node produces an associated data byte in the delta-file that is not equal to zero and a zero cost value is assigned to each network node for which the state associated with the network node produces the associated data byte in the delta-file that is equal to zero.

6. The method as claimed in claim 1, wherein the zero cost value is assigned to each network edge for which the network nodes connected thereby belong to same or compatible pseudo-matches, and the non-zero value is assigned to each network edge for which the network nodes connected thereby belong to different pseudo-matches.

7. The method as claimed in claim 1, further comprising producing pseudo-matches by
producing of a set of exactly matching maximum elemental data regions, defined as matches, present in the first and second data files;
ascertaining compatible matches with positions thereof respectively differing in the first and second data files by a same amount;
producing pseudo-matches by combining respectively compatible matches to form a combined data region.

8. The method as claimed in claim 1, wherein said ascertaining the cost-optimized path includes reducing the pseudo-matches based on a cost comparison of costs, which occur if a match is used or not known within a gap of one of the pseudo-matches.

9. The method as claimed in claim 1, further comprising selecting a set of non-overlapping pseudo-matches from the pseudo-matches to maximize overlapping of the second data file by exact matches.

10. The method as claimed in claim 1, further comprising compressing the delta-file.

11. A non-transitory computer-readable medium encoded with a computer program that when executed by an electronic data processing device causes the electronic data processing device to carry out a method comprising:
determining a set of elemental data strings defined as pseudo-matches present in the two data files in a partial match;
modeling a graph of network nodes and network edges in which each network node represents a data processing operation based on the first data file for producing one of the data bytes of the second data file, and each related node, associated with a data byte of the second data file in the graph, is connected by related network edges to all preceding network nodes associated with a directly preceding data byte of the second data file;
assigning the network nodes and the network edges, respectively, a cost value;
ascertaining a cost-optimized path in the graph which, for all data bytes of the second data file, contains only one network node per data byte; and
generating a delta-file, based on the cost-optimized path, containing a series of data processing operations and data fields corresponding to a successive sequence of network nodes in the cost-optimized path.

12. The computer-readable medium as claimed in claim 11, wherein the data processing operations based on the first data file for producing one of the data bytes of the second data file are respectively specific to a pseudo-match.

13. The computer-readable medium as claimed in claim 12,
wherein the data processing operations based on the first data file for producing one of the data bytes of the second data file include ADD-operations and Diff-operations,
wherein reading of an ADD data field associated with an ADD-operation from the delta-file is effected by an ADD-operation, and storage thereof is effected at a first position in the second data file corresponding to a second position of the data byte with which the ADD-operation is associated, and
wherein said generating includes storing a data byte sum, totaled from a DIFF data field of a DIFF-operation and a corresponding data byte of the pseudo-match of the first data file, by a specific DIFF-operation for a specific pseudo-match at a third position in the second data file which corresponds to a fourth position of the data byte to which the specific DIFF-operation is assigned.

14. The computer-readable medium as claimed in claim 11, wherein said modeling of the graph uses a matrix formed of lines and columns with successive columns of the graph assigned to successive data bytes of the second data file.

15. The computer-readable medium as claimed in claim 11, wherein a non-zero cost value is assigned to each network node for which a state associated with the network node produces an associated data byte in the delta-file that is not equal to zero and a zero cost value is assigned to each network node for which the state associated with the network node produces the associated data byte in the delta-file that is equal to zero.

16. The computer-readable medium as claimed in claim 11, wherein the zero cost value is assigned to each network edge for which the network nodes connected thereby belong to same or compatible pseudo-matches, and the non-zero value is assigned to each network edge for which the network nodes connected thereby belong to different pseudo-matches.

17. The computer-readable medium as claimed in claim 11, the method further comprising producing pseudo-matches by
producing of a set of exactly matching maximum elemental data regions, defined as matches, present in the first and second data files;
ascertaining compatible matches with positions thereof respectively differing in the first and second data files by a same amount;
producing pseudo-matches by combining respectively compatible matches to form a combined data region.

18. The computer-readable medium as claimed in claim 11, wherein said ascertaining the cost-optimized path includes reducing the pseudo-matches based on a cost comparison of costs, which occur if a match is used or not known within a gap of one of the pseudo-matches.

19. The computer-readable medium as claimed in claim 11, the method further comprising selecting a set of non-overlapping pseudo-matches from the pseudo-matches to maximize overlapping of the second data file by exact matches.

20. The computer-readable medium as claimed in claim 11, the method further comprising compressing the delta-file.

* * * * *